United States Patent
Xu

(10) Patent No.: US 10,803,803 B2
(45) Date of Patent: Oct. 13, 2020

(54) ORGANIC LIGHT EMITTING DIODE PIXEL COMPENSATION METHOD, ORGANIC LIGHT EMITTING DIODE PIXEL COMPENSATION DEVICE AND DISPLAY DEVICE

(71) Applicant: BOE TECHNOLOGY GROUP CO., LTD., Beijing (CN)

(72) Inventor: Pan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 132 days.

(21) Appl. No.: 15/869,625

(22) Filed: Jan. 12, 2018

(65) Prior Publication Data

US 2018/0322830 A1    Nov. 8, 2018

(30) Foreign Application Priority Data

May 4, 2017   (CN) .......................... 2017 1 0308783

(51) Int. Cl.
| | | |
|---|---|---|
| G09G 3/3258 | (2016.01) | |
| H01L 51/52 | (2006.01) | |
| G09G 3/3233 | (2016.01) | |
| H01L 51/00 | (2006.01) | |
| G09G 3/00 | (2006.01) | |

(52) U.S. Cl.
CPC .......... *G09G 3/3258* (2013.01); *G09G 3/006* (2013.01); *G09G 3/3233* (2013.01); *H01L 51/0031* (2013.01); *H01L 51/5203* (2013.01); *G09G 2300/0819* (2013.01); *G09G 2300/0842* (2013.01); *G09G 2310/0264* (2013.01); *G09G 2310/08* (2013.01)

(58) Field of Classification Search
CPC ............ H01L 51/0031; H01L 51/5203; G09G 3/3258; G09G 3/3233; G09G 3/006; G09G 2310/0264; G09G 2310/08; G09G 2300/0819; G09G 2300/0842
See application file for complete search history.

(56) References Cited

U.S. PATENT DOCUMENTS

| 2009/0244055 A1* | 10/2009 | Asano .................. G09G 3/3233 345/214 |
| 2013/0099692 A1* | 4/2013 | Chaji ..................... H05B 37/02 315/224 |

* cited by examiner

*Primary Examiner* — Christopher E Leiby
(74) *Attorney, Agent, or Firm* — Brooks Kushman P.C.

(57) ABSTRACT

An organic light emitting diode pixel compensation method, an organic light emitting diode pixel compensation device and a display device are provided. The organic light emitting diode pixel compensation method includes: testing drive transistors of sub-pixels in an $N^{th}$ row to obtain first test information; testing drive transistors of sub-pixels in an $M^{th}$ row to obtain second test information; calculating a compensation parameter based on the first test information and the second test information; and compensating the sub-pixels in the $N^{th}$ row, the sub-pixels in the $M^{th}$ row and the sub-pixels in a rows adjacent to the $N^{th}$ row and the $M^{th}$ row based on the compensation parameter, where $N=an+b$, $M=an+c$, $a \geq 2$, $0 \leq b < a$, $0 \leq c < a$, and a, b, c and n are each an integer.

13 Claims, 2 Drawing Sheets

ORGANIC LIGHT EMITTING DIODE PIXEL COMPENSATION METHOD, ORGANIC LIGHT EMITTING DIODE PIXEL COMPENSATION DEVICE AND DISPLAY DEVICE

CROSS-REFERENCE TO RELATED APPLICATION

This application claims priority to Chinese Patent Application No. 201710308783.3 filed on May 4, 2017, which is incorporated herein by reference in its entirety.

TECHNICAL FIELD

The present disclosure relates to the field of display technology, and in particular to an organic light emitting diode pixel compensation method, an organic light emitting diode pixel compensation device and a display device.

BACKGROUND

Organic light emitting diodes (OLED) are widely used in the field of high performance displays as a current-mode light-emitting device, because of advantages such as active light emission, fast response, a large visibility angle and a capability of fabricating a flexible substrate. According to a driving mode, the organic light emitting diode may be divided into a Passive Matrix Driving OLED (PMOLED) and an Active Matrix Driving OLED (AMOLED). The AMOLED displays are expected to become the next generation flat panel display to replace the Liquid Crystal Display (LCD), because of advantages such as a low manufacturing cost, a high response speed, a low power consumption, a capability of driving portable devices in a direct current manner and a wide operating temperature range.

For an AMOLED TV with a large size, the brightness uniformity of a screen is a major difficulty in product development in the related art. At present, techniques for improving the brightness uniformity include an electrical compensation and an optical compensation, and the electrical compensation includes an internal compensation and an external compensation. As the processing technique is not mature, the electrical compensation of the AMOLED light emitting diode products with a large size in the related art is mainly the external compensation. In the related art, an external compensation method includes scanning sub-pixels of a display panel row by row and compensating the sub-pixels by using an original parameter before a new I-V model is established. Accordingly, if the TFT characteristic is changed before the new I-V model is established, a great error tends to occur to the brightness compensation of the display panel, as a compensation parameter is still generated based on an original I-V model.

It should be noted that information disclosed in the above related art is merely to facilitate the understanding of the background of the present disclosure, and thus the information may not be known to those skilled in the art.

SUMMARY

The present disclosure provides an organic light emitting diode pixel compensation method. The method includes:

testing drive transistors of sub-pixels in an $N^{th}$ row to obtain first test information;

testing drive transistors of sub-pixels in an $M^{th}$ row to obtain second test information;

calculating a compensation parameter based on the first test information and the second test information; and compensating the sub-pixels in the $N^{th}$ row, the sub-pixels in the $M^{th}$ row and the sub-pixels in a rows adjacent to the $N^{th}$ row and the $M^{th}$ row based on the compensation parameter, where N=an+b, M=an+c, a≥2, 0≤b<a, 0≤c<a, and a, b, c and n are each an integer.

Optionally, N is an odd or even number, and M is an odd or even number.

Optionally, the testing the drive transistors of the sub-pixels in the $N^{th}$ row and obtaining the first test information and testing the drive transistors of the sub-pixels in the $M^{th}$ row and obtaining the second test information includes:

applying a test signal voltage to a control terminal of each drive transistor through a data line, to turn on the drive transistor;

charging a test capacitor through an output current of the drive transistor; and detecting a voltage of the test capacitor and obtaining output current data of the drive transistor based on the voltage of the test capacitor, where the first test information and the second test information each includes the test signal voltage and the output current data.

Optionally, the testing the drive transistors of the sub-pixels in the $N^{th}$ row and obtaining the first test information and testing the drive transistors of the sub-pixels in the $M^{th}$ row and obtaining the second test information includes:

applying a test signal voltage to a control terminal of each drive transistor through a data line, to turn on the drive transistor; and acquiring output current data of the drive transistor, where the first test information and the second test information each includes a test signal voltage and the output current data.

Optionally, the compensation parameter includes a threshold voltage and mobility.

Optionally, the calculating the compensation parameter based on the first test information and the second test information includes:

calculating the compensation parameter based on the following formulas:

$$I_1 = K^* u (V_{gs1} - V_{th})^2$$

$$I_2 = K^* u (V_{gs2} - V_{th})^2$$

where $I_1$ is the output current data in the first test information, $I_2$ is the output current data in the second test information, $V_{gs1}$ is the test signal voltage in the first test information, $V_{gs2}$ is the test signal voltage in the second test information, u is the mobility, and $V_{th}$ is the threshold voltage.

Optionally, the method further includes testing the drive transistors of the sub-pixels in the $N^{th}$ row and the $M^{th}$ row during a data blank time period of each frame Optionally, N is an odd number, M is an even number following N, and the compensating the sub-pixels in the $N^{th}$ row, the sub-pixels in the $M^{th}$ row and the sub-pixels in a rows adjacent to the $N^{th}$ row and the $M^{th}$ row based on the compensation parameter includes:

compensating the sub-pixels in the $N^{th}$ row and the sub-pixels in the $M^{th}$ row based on the compensation parameter.

Optionally, N and M are each an odd number, and the compensating the sub-pixels in the $N^{th}$ row, the sub-pixels in the $M^{th}$ row and the sub-pixels in a rows adjacent to the $N^{th}$ row and the $M^{th}$ row includes:

compensating the sub-pixels in the $N^{th}$ row, the sub-pixels in the $M^{th}$ row and the sub-pixels in odd-numbered rows adjacent to the $N^{th}$ row and the $M^{th}$ row based on the compensation parameter.

Optionally, N and M are each an even number, and the compensating the sub-pixels in the $N^{th}$ row, the sub-pixels in the $M^{th}$ row and the sub-pixels in a rows adjacent to the $N^{th}$ row and the $M^{th}$ row further includes:

compensating the sub-pixels in the $N^{th}$ row, the sub-pixels in the $M^{th}$ row and the sub-pixels in even-numbered rows adjacent to the $N^{th}$ row and the $M^{th}$ row based on the compensation parameter.

Optionally, N and M are each an even number, and the compensating the sub-pixels in the $N^{th}$ row, the sub-pixels in the $M^{th}$ row and the sub-pixels in a rows adjacent to the $N^{th}$ row and the $M^{th}$ row includes:

compensating the sub-pixels in the $N^{th}$ row and the sub-pixels in odd-numbered rows adjacent to the $N^{th}$ row based on the compensation parameter; and compensating sub-pixels in the $M^{th}$ row and the sub-pixels in odd-numbered rows adjacent to the $M^{th}$ row based on the compensation parameter.

The present disclosure further provides an organic light emitting diode pixel compensation device. The device includes:

a first test information obtaining module, configured to test drive transistors of sub-pixels in an $N^{th}$ row to obtain first test information;

a second test information obtaining module, configured to test drive transistors of sub-pixels in an $M^{th}$ row to obtain second test information;

a compensation parameter obtaining module, configured to calculate a compensation parameter based on the first test information and the second test information; and a pixel compensating module, configured to compensate the sub-pixels in every row based on the compensation parameter, where $N=an+b$, $M=an+c$, $a \geq 2$, $0 \leq b < a$, $0 \leq c < a$, and a, b, c and n are each an integer.

The present disclosure further provides a display device, which includes the above organic light emitting diode pixel compensating device.

Optionally, the display device further includes:

a display panel, comprising a plurality of sub-pixels arranged in an array form, a plurality of scan lines and data lines coupled to every sub-pixels;

a source electrode driver, coupled to the organic light emitting diode pixel compensation device and configured to generate a raw data signal and output, to the data lines, a compensated data signal formed by compensating the raw data signal through the organic light emitting diode pixel compensation device; and a gate electrode driver, coupled to the scan lines and configured to generate a scan signal and output the scan signal to the scan lines of the display panel.

It should be appreciated that the foregoing general description and the following detailed description are only for examples and explanations, but not to limit the present disclosure.

BRIEF DESCRIPTION OF THE DRAWINGS

The accompanying drawings incorporated into the specification constitute a part of the specification and illustrate embodiments of the present disclosure, and the drawings described hereinafter together with the specification are to illustrate principles of the present disclosure. Obviously, the drawings described hereinafter are only for some embodiments of the present disclosure, and other drawings may be obtained by those skilled in the art based on those drawings without creative efforts.

Figure 1:
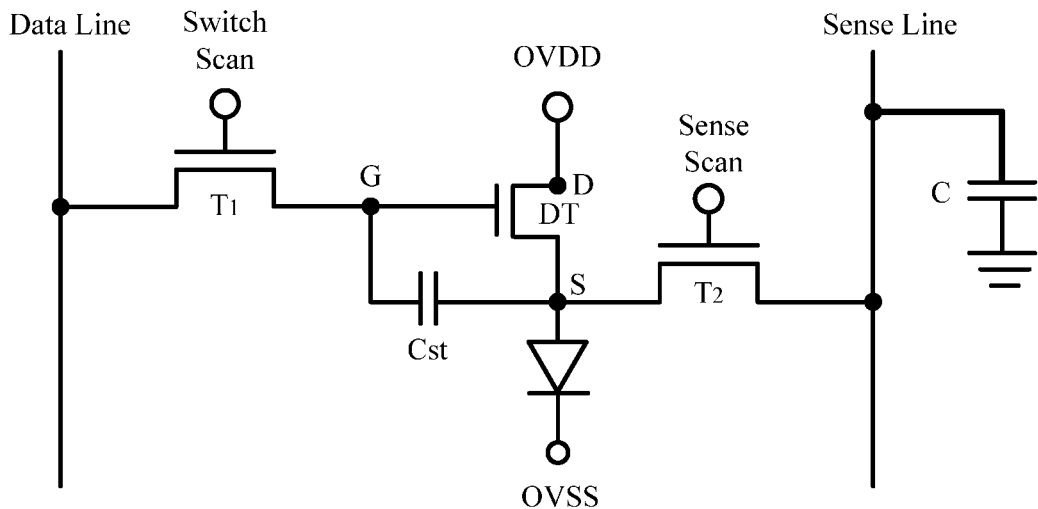
FIG. 1 is a schematic diagram of an organic light emitting diode pixel unit in some embodiments of the present disclosure.

References in the drawings are described as follows:
Switch Scan: first scan signal
Sense Scan: second scan signal
OVDD: first voltage signal terminal
OVSS: second voltage signal terminal
DT: drive transistor
T1: first transistor
T2: second transistor
C: charging capacitor

DETAILED DESCRIPTION

Hereinafter embodiments will be described fully with reference to the drawings. However, embodiments can be embodied in a variety of forms and should not be construed as limiting to the exemplary embodiments described hereinafter. These embodiments make the present disclosure thorough and complete and fully convey the concept of the embodiments to those skilled in the art. The described features, structures, or characteristics can be combined in one or more embodiments in any suitable manner.

Moreover, the drawings are merely schematic diagrams of the present disclosure and not necessarily drawn to scale. The same reference numerals in the drawings denote the same or similar parts, a repetitive description of which will be omitted. Some blocks in the drawings represent functional entities and do not necessarily correspond to physical or logical independent entities. These functional entities may be implemented in a form of software, in one or more hardware modules or integrated circuits, or in different networks, and/or processor devices and/or microcontroller devices.

The present disclosure provides in some embodiments an organic light emitting diode pixel compensation method, to compensate a threshold voltage $V_{th}$ and a mobility u of a drive transistor DT to shorten the data detection time. FIG. 1 is a schematic diagram of an organic light emitting diode pixel unit in some embodiments of the present disclosure. The organic light emitting diode pixel unit includes a drive transistor DT and an organic light emitting diode component. The drive transistor DT is coupled to an terminal of the organic light emitting diode component, a control terminal of the drive transistor DT is coupled to a data line (Data line) via a first transistor T1, a first terminal of the drive transistor DT is coupled to a first voltage signal terminal OVDD, a second terminal of the drive transistor DT is coupled to a sense line (Sense line) via a second transistor T2, and the other terminal of the organic light emitting diode component is coupled to a second voltage signal terminal OVSS. A control terminal of the first transistor T1 receives a first scan signal (Switch Scan), and a control terminal of the second transistor T2 receives a second scan signal (Sense Scan).

Figure 2:
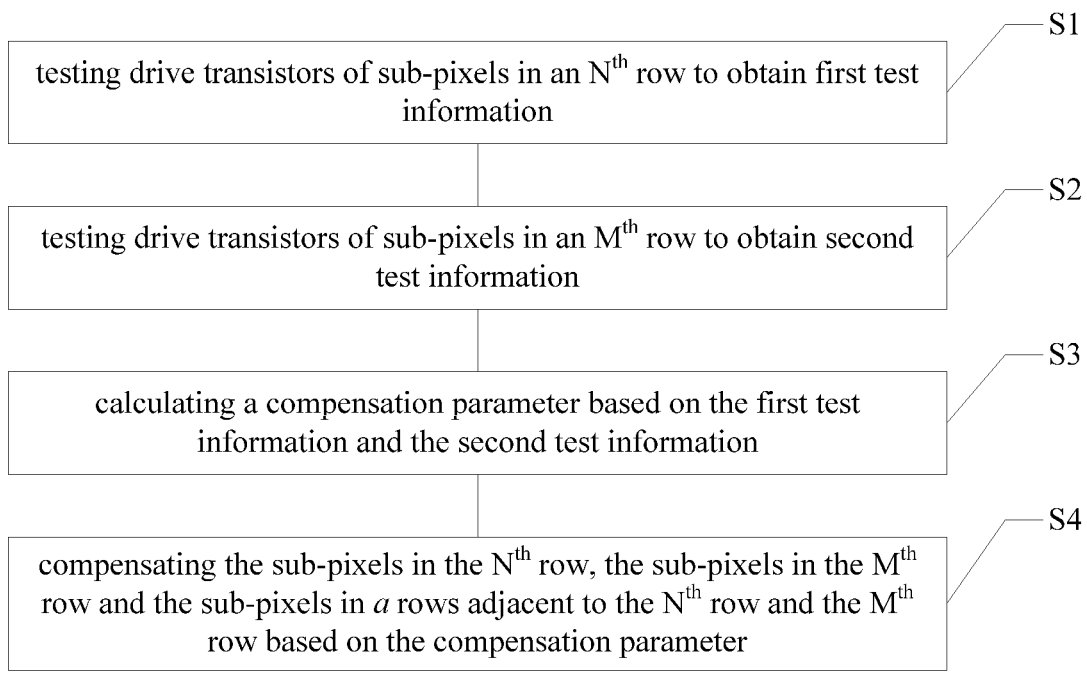
FIG. 2 is a schematic diagram of an organic light emitting diode pixel compensation method in some embodiments of the present disclosure.

Referring to FIG. 2, the organic light emitting diode pixel compensation method may include:

step S1: testing drive transistors of sub-pixels in an $N^{th}$ row to obtain first test information;

step S2: testing drive transistors of sub-pixels in an $M^{th}$ row to obtain second test information;

step S3: calculating a compensation parameter based on the first test information and the second test information; and step S4: compensating the sub-pixels in the $N^{th}$ row, the sub-pixels in the $M^{th}$ row and the sub-pixels in a rows adjacent to the $N^{th}$ row and the $M^{th}$ row based on the compensation parameter, where N=an+b, M=an+c, a≥2, 0≤b<a, 0≤c<a, and a, b, c and n are each an integer.

In the organic light emitting diode pixel compensation method in at least one embodiment of the present disclosure, the drive transistors of the sub-pixels in the $N^{th}$ row and the $M^{th}$ row are tested in sequence to obtain the first test information and the second test information, the compensation parameter is calculated based on the first test information and the second test information, and the sub-pixels in the $N^{th}$ row, the sub-pixels in the $M^{th}$ row and the sub-pixels in the rows adjacent to the $N^{th}$ row and the $M^{th}$ row are compensated. In such a manner, by reducing the number of the tested rows of the sub-pixels, the data detection time is shortened, thereby shortening an updating period of the compensation parameter. Because the updating period is shortened and the obtained compensation parameter corresponding to the sub-pixels in a certain row is applied to the sub-pixels in the adjacent rows, it is able to compensate the panel lightness in real time, thereby improving the compensation effect and reducing the compensation error.

The organic light emitting diode pixel compensation method in some embodiments of the present disclosure will be described below in detail.

In steps S1 and S2, the drive transistors of the sub-pixels in the $N^{th}$ row are tested to obtain the first test information, and the drive transistors of the sub-pixels in the $M^{th}$ row are tested to obtain the second test information, where N=an+b, M=an+c, a≥2, 0≤b<a, 0≤c<a, and a, b, c and n are each an integer.

When testing the drive transistors DT of the sub-pixels, the sub-pixels in odd-numbered rows and the sub-pixels in even-numbered rows are scanned respectively, instead of scanning the sub-pixels row by row, where N may be an odd or even number, and M may be an odd or even number. For example, in a case that a=2, b=1, and c=0, firstly the drive transistors of the sub-pixels in odd-numbered rows are tested to obtain the first test information, and then the drive transistors of the sub-pixels in even-numbered rows are tested to obtain the second test information. Alternatively, in a case that a=2, b=0, and c=0, firstly the drive transistors of the sub-pixels in even-numbered rows are tested to obtain the first test information, and then the drive transistors of the sub-pixels in the even-numbered rows are tested again to obtain the second test information. Alternatively, in a case that a=2, b=1, and c=1, firstly the drive transistors of the sub-pixels in odd-numbered rows are tested to obtain the first test information, and then the drive transistors of the sub-pixels in the odd-numbered rows are tested again to obtain the second test information, and so on.

A manner for testing the drive transistors DT in a period may be different from that in the previous period. For example, in a first period, the drive transistors of the sub-pixels in odd-numbered rows and the drive transistors of the sub-pixels in even-numbered rows are tested respectively, and in the second period, the drive transistors of the sub-pixels in the even-numbered rows or the odd-numbered rows may be tested twice, which is not limited by the present disclosure.

In step S3, the compensation parameter is calculated based on the first test information and the second test information.

In some embodiments of the present disclosure, the compensation parameters may include a threshold voltage and mobility. The mobility u is an average moving speed of carriers per electric field intensity, thus a difference of the mobility in the panel may be caused due to non-uniform of a film thickness and film quality in the process, and the mobility varies with the environment in operating. The threshold voltage $V_{th}$ is a critical value for turning TFT (thin film transistor) on and off. Similarly, a $V_{th}$ difference among TFTs in the panel may also be caused due to non-uniform of the film thickness and film quality, and the threshold voltage tends to be changed with an external environment or an operating voltage due to a defect in an internal film layer.

In an external compensation of an AMOLED TV with a large size, characteristic information of the drive thin film transistor is detected by an external drive IC, and is processed by an external information processor to obtain a new relationship between a test voltage $V_{gs}$ and an output current I of the DT, that is, a relationship between gray scale and brightness, as the following formula, $$I = \frac{1}{2} Cox * u * \frac{W}{L} (V_{gs} - V_{th})^2$$

where I is the output current, $V_{gs}$ is a test signal voltage, $V_{th}$ is the threshold voltage, u is the mobility, Cox is a dielectric constant of a gate insulating layer of the thin film transistor, and W/L is a width to length ratio of the thin film transistor.

Once the output current I and the test signal voltage $V_{gs}$ are determined, an accurate brightness of any product specification may be obtained. The mobility u and the threshold voltage $V_{th}$ in the above formula are main factors for compensating the brightness. In view of the above, the panel brightness uniformity may be compensated not only in an optical or an electrical compensation manner for one time, but also compensated in real time based on real-time changes of the mobility and the threshold voltage.

The calculating the compensation parameter based on the first test information and the second test information includes:

calculating the compensation parameter through the following formulas:

$$I_1 = K * u (V_{gs1} - V_{th})^2 \quad (1)$$

$$I_2 = K * u (V_{gs2} - V_{th})^2 \quad (2)$$

where $I_1$ is the output current data in the first test information, $I_2$ is the output current data in the second test information, $V_{gs1}$, is the test signal voltage in the first test information, $V_{gs2}$ is the test signal voltage in the second test information, u is the mobility, $V_{th}$ is the threshold voltage, and K=½*Cox*W/L, which is a constant, where Cox is the dielectric constant of the gate insulating layer of the thin film transistor, and W/L is a width to length ratio of the thin film transistor.

According to the above equations (1) and (2), the mobility u and the threshold voltage $V_{th}$ are obtained, when two variables ($V_{gs1}$, $I_1$) and ($V_{gs2}$, $I_2$) are known.

In step S4, the sub-pixels in the $N^{th}$ row, the sub-pixels in the $M^{th}$ row and the sub-pixels in a rows adjacent to the $N^{th}$ row and the $M^{th}$ row are compensated based on the compensation parameter, where N=an+b, M=an+c, a≥2, 0≤b<a, 0≤c<a, and a, b, c and n are each an integer.

As an example, in a case that N is an odd number, and M is an even number, the drive transistors DT of the sub-pixels in odd-numbered rows are tested to obtain the first test information, the drive transistors DT of the sub-pixels in even-numbered rows are tested to obtain the second test information, and new I-$V_{gs}$ models are determined based on the first and the second test information to calculate compensation data, and the same compensation data is applied in the sub-pixels in the odd-numbered rows and the adjacent even-numbered rows. For example, the compensation data obtained based on the test information of the sub-pixels in the first row and the second row is applied to the sub-pixels in the first row and the second row, and the compensation data obtained based on the test information of the sub-pixels in the third row and the fourth row is applied to the sub-pixels in the third row and the fourth row, and so on.

Optionally, firstly the drive transistors of the sub-pixels in odd-numbered rows are tested to obtain the first test information, and then the drive transistors of the sub-pixels in the odd-numbered rows are tested again to obtain the second test information, the compensation data is obtained based on the obtained test information and applied to the sub-pixels in the odd-numbered rows and the sub-pixels in the adjacent odd-numbered rows. In the following update period of the compensation data, the drive transistors DT of the sub-pixels in the even-numbered rows are tested twice, and the obtained compensation data is applied to the sub-pixels in the even-numbered rows and the sub-pixels in the adjacent even-numbered rows.

Optionally, first data detection and second data detection are each performed on the drive transistors in the even-numbered rows, the compensation data is obtained based on the first and second test information, and the compensation data is applied to the sub-pixels in the even-numbered rows and the sub-pixels in the adjacent odd-numbered rows. For example, the drive transistors of the sub-pixels in the second, fourth, sixth . . . rows are tested twice to obtain the first test information and the second test information, respectively, the compensation data is calculated based on the first test information and the second test information, the compensation data for the second row is applied to the drive transistors of the sub-pixels in the second row, the first row and/or the third row, and the compensation data for the fourth row is applied to the drive transistors of the sub-pixels in the fourth row, the third row and/or the fifth row, and so on.

According to the AMOLED process characteristics and display characteristics, characteristics (u, $V_{th}$) of the DTs of the sub-pixels in adjacent rows are substantially the same, and a distance between the adjacent rows is very close, so the DT components in a small region may be made to have basically the same characteristics. Moreover, during the displaying, components of the sub-pixels in the adjacent rows are in the same environment (e.g., temperature and illumination) and almost the same grayscale voltage. Therefore, during the actual compensation, the compensation data obtained based on the tested data in one row may be applied to two components of the sub-pixels in the adjacent rows, without affecting the display effect.

Taking an example that a refresh rate is 60 Hz, a screen resolution is 4K (4096*2160), and a RGBW pixel arrangement is used, the conventional compensation parameter is scanned row by row, and an update period is T0=2160*16.7 ms*2*4≈288 s. In some embodiments of the present disclosure, an update period of the compensation data is T=(2160/2)*16.7 ms*2*4≈144 s, where only the sub-pixels in the odd-numbered rows or the even-numbered rows are tested twice, and RGBW shares a detection line. That is, the update period of the compensation data is about 144 s, and the characteristic of the drive transistor DT is required to be unchanged (or infinitesimally changed) within 144 s. In a case that one detection line is used by each of the sub-pixels (Sub_Pixel), T=(2160/2)*16.7 ms*2.

As the voltage is applied on the drive transistor DT for a longer time, the influence from the external environment (illumination and temperature) is larger, and u and $V_{th}$ changes are greater. Before a new compensation parameter is obtained, the greater the u and $V_{th}$ changes are, the greater the display error is, that is, the greater the compensation error is. In case of a same process, the time of detecting the test information in the method according to at least one embodiments of the present disclosure is shorter than that in the related art, and the update period of the compensation parameter can be greatly shorten as compared with the external compensation method in the related art, thereby reducing the error caused by the compensation parameter. Therefore, the panel can be accurately compensated.

Reference is made to the test data in Table 1, which is data of the threshold voltage $V_{th}$ and the mobility u of a Metal Oxide TFT changing with time at different temperatures and bias voltages (PBTS). The data in the table shows that the threshold voltage $V_{th}$ and the mobility u of the TFT are constantly changing with the operating time.

TABLE 1

| | PBTS | | temperature (60° C.) | |
|---|---|---|---|---|
| Time | $V_{th}$ | Delta $V_{th}$ | u | Delta u |
| 0 S | 0.2 V | 0 V | 10.21 cm²/V*S | 0 cm²/V*S |
| 30 s | 0.25 V | 0.05 V | 10.26 cm²/V*S | 0.05 cm²/V*S |
| 60 s | 0.26 V | 0.06 V | 10.28 cm²/V*S | 0.07 cm²/V*S |
| 90 s | 0.26 V | 0.06 V | 10.29 cm²/V*S | 0.08 cm²/V*S |
| 120 s | 0.27 V | 0.07 V | 10.31 cm²/V*S | 0.1 cm²/V*S |
| 150 s | 0.27 V | 0.07 V | 10.33 cm²/V*S | 0.12 cm²/V*S |
| 180 s | 0.28 V | 0.08 V | 10.35 cm²/V*S | 0.14 cm²/V*S |
| 210 s | 0.28 V | 0.08 V | 10.36 cm²/V*S | 0.15 cm²/V*S |
| 240 s | 0.28 V | 0.08 V | 10.37 cm²/V*S | 0.16 cm²/V*S |
| 270 s | 0.29 V | 0.09 V | 10.39 cm²/V*S | 0.18 cm²/V*S |
| 300 s | 0.3 V | 0.1 V | 10.42 cm²/V*S | 0.21 cm²/V*S |

Generally, $V_{th}$ of such a TFT is affected by many factors such as temperature, illumination and gate voltage, and these factors must be experienced by an organic light emitting diode product. Therefore, in view of the long-term use of products, on the one hand, the process is required to be good enough to make the TFTs have a good stability, and on the other hand, the TFTs require to be compensated in a real-time manner during operating. If the TFT does not have a good stability, the compensation error occurs in case of a constant update period of the compensation parameter. Therefore, the detection time of the test information is shortened, and duration of updating the compensation parameter is shortened, which reduces the compensation error, and thus effectively improving the compensation accuracy.

In addition, in some embodiments of the present disclosure, based on a product design, such as a resolution, the size of the panel and the uniformity of the process, the drive transistors in every three rows, four rows or more rows may be tested in the data detection, and the compensation data is applied to the three rows, four rows or more rows of the sub-pixels.

For example, in a case that a=3, b=2, and c=2, the drive transistors of the sub-pixels in the second, fifth, eighth, ... $(3n+2)^{th}$ row of the panel are tested twice to obtain the first test information and the second information, and the calculated compensation parameters may be applied to the sub-pixels in the second, fifth, eighth, ... $(3n+2)^{th}$ row, and the sub-pixels in two rows adjacent to each of the second, fifth, eighth, ... $(3n+2)^{th}$ row. Similarly, transistors in every 4, 5, 6 or more rows may be tested, and the same compensation parameters are applied to the sub-pixels in every 4, 5, 6 or more rows, that is, a=4, 5, 6, etc. The optimal detection solution may be selected according to specific product characteristics, which is not limited by the present disclosure herein.

In some embodiments of the present disclosure, the testing the drive transistor may include:

Step S111, applying a test signal voltage to a control terminal of each drive transistor through a data line, to turn on the drive transistor;

Step S112, charging a test capacitor through an output current of the drive transistor; and Step S113, detecting a voltage of the test capacitor and obtaining output current data of the drive transistor based on the voltage of the test capacitor, where the first test information and the second test information each includes a test signal voltage and the output current data.

In detecting, the test signal voltage $V_{gs}$ is applied to the data line, and a first transistor T1 is turned off and a second transistor T2 is normally turned on. In such a manner, a current generated by the drive transistor DT flows through the second transistor T2 and charges a charging capacitor C on the detection line, after a period of time (Charge Time), a voltage on the detection line is detected by an external drive IC, and data information of a charging current I is obtained according to a formula CV=IT. $V_{gs}$ is preset by a peripheral driver circuit, and a data relationship of $(V_{gs}, I)$ may be obtained. $(V_{gs1}, I_1)$ and $(V_{gs2}, I_2)$ may be obtained by performing the above steps twice.

Optionally, in some embodiments of the present disclosure, the driving the drive transistor may further include:

step S121, applying a test signal voltage to a control terminal of each drive transistor through a data line, to turn on the drive transistor; and step S122, acquiring output current data of the drive transistor, where the first test information and the second test information each includes a test signal voltage and the output current data.

In detecting, the test signal voltage $V_{gs}$ is applied to the data line, and the first transistor T1 is turned off and a second transistor T2 is normally turned on. In such a manner, the output current I is acquired by the external drive IC, the current data of the output current I is obtained by a counter and a comparator inside the external drive IC, and the data relationship of $(V_{gs}, I)$ may be obtained. $(V_{gs1}, I_1)$ and $(V_{gs2}, I_2)$ may be obtained by performing the above steps twice.

In some embodiments of the present disclosure, in order to make the data detection not prolong the update period of the compensation data, the drive transistor may be tested in a data blank time of each frame.

Figure 3:
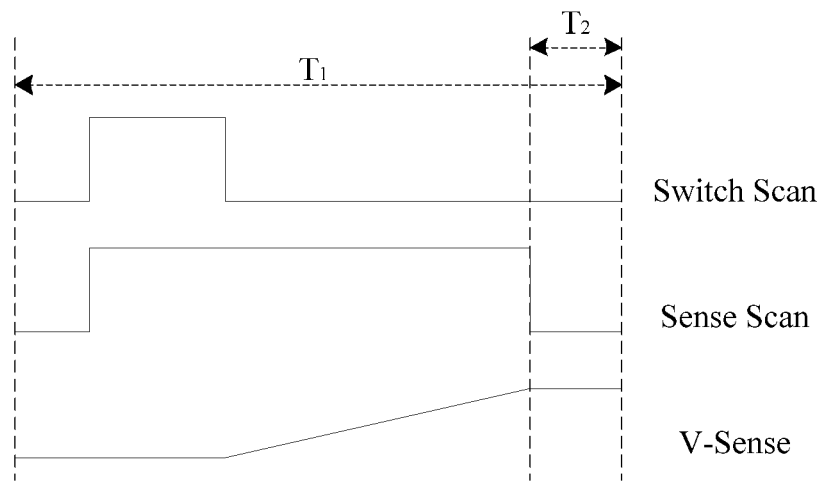
FIG. 3 shows a data detection time sequence diagram in some embodiments of the present disclosure.

The data is not transmitted all the time in a period of one frame. Taking an example that a frequency of a product is 60 Hz, there is duration about 600 microseconds in each frame when no data is transmitted, which is called data blank time (Blank Time). Referring to FIG. 3, T1 is the data blank time, T2 is a sampling time of the external drive IC, and the data detection may be performed within T1 in the external compensation.

It should be noted that the above figures are merely schematic illustrations for the processes in the method according to the exemplary embodiments of the present disclosure rather than limiting the present disclosure. It will be readily understood that the processes shown in the above figures do not indicate or limit the chronological order of these processes. In addition, it is also readily understood that these processes may be performed, for example, synchronously or asynchronously in multiple modules.

Figure 4:
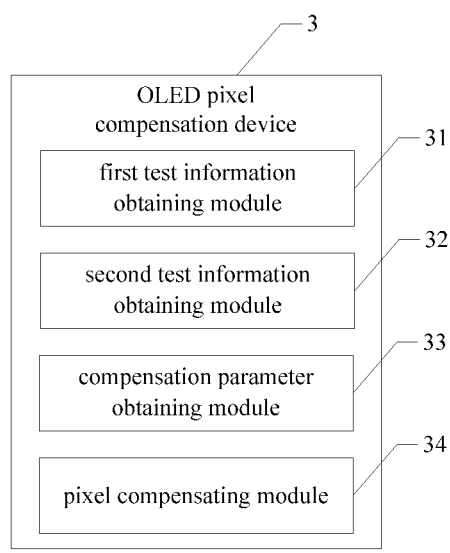
FIG. 4 is a schematic diagram of an organic light emitting diode pixel compensating device in some embodiments of the present disclosure.

Reference is made to FIG. 4, an organic light emitting diode pixel compensation device 3 is provided in some embodiments of the present disclosure, which includes a first test information obtaining module 31, a second test information obtaining module 32, a compensation parameter obtaining module 33 and a pixel compensating module 34.

The first test information obtaining module 31 is configured to test drive transistors of sub-pixels in an $N^{th}$ row to obtain first test information.

The second test information obtaining module 32 is configured to test drive transistors of sub-pixels in an $M^{th}$ row to obtain second test information.

The compensation parameter obtaining module 33 is configured to calculate a compensation parameter based on the first test information and the second test information.

The pixel compensating module 34 is configured to compensate the sub-pixels in every rows based on the compensation parameter, where N=an+b, M=an+c, a≥2, 0≤b<a, 0≤c<a, and a, b, c and n are each an integer.

According to the pixel compensation device in some embodiments of the present disclosure, the first test information obtaining module 31 and the second test information obtaining module 32 obtain the first test information and the second test information, respectively, the compensation parameter obtaining module 33 calculates the compensation parameter based on the obtained first test information and the second test information, and the pixel compensating module 34 compensates the sub-pixels based on the compensation parameter. The pixel compensation device in at least one embodiment of the present disclosure has a short update period of the compensation data, and effectively achieves the brightness compensation in a real-time manner, thereby reducing the compensation error and improving the compensation effect.

It should be noted that specific details of various modules and units in the device for compensating an organic light emitting diode pixel have been described in detail in the corresponding organic light emitting diode pixel compensation method, which is not repeated herein.

In some embodiments of the present disclosure, the first test information obtaining module 31 and the second test information obtaining module 32 may be an identical test information obtaining module configured to test the transistors of the sub-pixels in the $N^{th}$ row and the $M^{th}$ row in sequence.

A display device is further provided in some embodiments of the present disclosure, which includes the above organic light emitting diode pixel compensation device. The display device further includes a display panel, a source electrode driver and a gate electrode driver.

The display panel may include a plurality of sub-pixels arranged in an array form, a plurality of scan lines and a plurality of data lines coupled to every sub-pixel.

The source electrode driver may be coupled to the organic light emitting diode pixel compensation device and configured to generate a raw data signal and output, to the data lines, a compensated data signal formed by compensating the raw data signal through the organic light emitting diode pixel compensation device.

The gate electrode driver may be coupled to the scan lines and configured to generate a scan signal and output the scan signal to the scan lines of the display panel.

The display device in at least one embodiment of the present disclosure has a short update period of the compensation data, and effectively achieves the brightness compensation in a real-time manner, thereby reducing the compensation error and improving the compensation effect.

In some embodiments of the present disclosure, the display device may include any product or component having a display function, such as a cell phone, a tablet computer, a television, a notebook computer, a digital picture frame, and a navigator.

It should be appreciated by those skilled in the art that the present disclosure includes one or more devices configured to perform the operations described in the present disclosure. These devices may be specially designed and manufactured for required purposes, or may also include a known device in general purpose computers. These devices have computer programs stored therein, which are selectively activated or reconfigured. Such a computer program may be stored in a device (e.g., computer) readable medium, or in any type of medium adapted to store electronic instructions and respectively coupled to a bus. The computer readable medium includes, but not limited to, any type of disk (including a floppy disk, a hard disk, an optical disk, a CD-ROM and a magneto-optical disk), ROM (Read-Only Memory), RAM (Random Access Memory), EPROM (Erasable Programmable Read-Only Memory), EEPROM (Electrically Erasable Programmable Read-Only Memory), flash memory, magnetic card, or optical card. That is, the readable medium includes any medium that stores or transmits information in a form readable by the device (e.g., computer).

It should be appreciated by those skilled in the art that each block in the structural diagram and/or block diagram and/or flow chart and a combination of blocks thereof can be implemented by computer program instructions, and these computer program instructions can be provided to a processor of a general purpose computer, a special purpose computer, or other programmable data processing devices to execute steps or functions specified by the one or more blocks in the structural diagram and/or block diagram and/or flow chart.

The functional members described in the specification are referred to as modules, so as to emphasize the independence of the implementation in a more particular manner.

According to the embodiments of the present disclosure, the modules may be implemented by software, so as to be executed by various processors. For example, an identified, executable code module may include one or more physical or logical blocks including computer instructions, and the module can be constructed as an image, a process or a function. Even so, the executable codes of the identified modules are unnecessary to be physically located together, but may include different instructions stored in different locations. When these instructions are logically combined together, they form the modules and achieve the prescribed purposes of the modules.

Actually, the executable code module may be a single instruction or a plurality of instructions, and can even be distributed at different code segments, in different programs, or across a plurality of memory devices. Also, operational data may be identified in the modules, implemented in any appropriate form, and organized in any data structure of an appropriate type. The operational data may be collected as a single data set, or distributed at different locations (including different memory devices), and may be at least partially present in a system or network merely as an electronic signal.

When the modules can be implemented by software, considering the current hardware level, a person skilled in the art can build a corresponding hardware circuit to achieve the corresponding function if taking no account of the cost. The hardware circuit comprises a conventional very-large-scale integration (VLSI) circuit, a gate array, an existing semiconductor such as a logic chip and a transistor, or other discrete components. The modules may further be implemented by a programmable hardware device, such as a field-programmable gate array, a programmable array logic device and a programmable logic device.

Other embodiments of the present disclosure will readily occur to those skilled in the art upon consideration of the specification and upon implementation of the present invention as disclosed herein. The present application is intended to cover any variations, applications, or adaptations of the present disclosure that follow the general principles of the present disclosure and include general knowledge or commonly used technology in the art, which is not disclosed in the present disclosure. The specification and embodiments are only considered as exemplary, and the true scope and spirit of the present disclosure are indicated by the enclosed claims.

What is claimed is:

1. An organic light emitting diode pixel compensation method, comprising:

in a first compensation data update period, testing drive transistors of sub-pixels in an $N^{th}$ row to obtain first test information;

testing drive transistors of sub-pixels in an $M^{th}$ row to obtain second test information;

calculating a compensation parameter based on the first test information and the second test information; and compensating the sub-pixels in the $N^{th}$ row, the sub-pixels in the $M^{th}$ row and the sub-pixels in a rows adjacent to the $N^{th}$ row and the $M^{th}$ row based on the compensation parameter, wherein the testing the drive transistors of the sub-pixels in the $N^{th}$ row and obtaining the first test information and testing the drive transistors of the sub-pixels in the $M^{th}$ row and obtaining the second test information comprises:

applying a test signal voltage to a control terminal of each drive transistor through a data line, to turn on the drive transistor;

charging a test capacitor through an output current of the drive transistor; and detecting a voltage of the test capacitor and obtaining output current data of the drive transistor based on the voltage of the test capacitor, wherein the first test information and the second test information each comprises the test signal voltage and the output current data;

the test capacitor is grounded;

wherein a time interval between the testing the drive transistors of the sub-pixels in the $N^{th}$ row to obtain the first test information and the testing the drive transistors of the sub-pixels in the $M^{th}$ row to obtain the second test information is a period of one frame;

the organic light emitting diode pixels at least comprises a red sub-pixel, a green sub-pixel and a blue sub-pixel, the red sub-pixel, the green sub-pixel and the blue sub-pixel are connected to a same data line, and configured to be applied a same detection signal;

wherein the calculating the compensation parameter based on the first test information and the second test information further comprises:

updating an initial I-$V_{gs}$ model based on the first test information and the second test information, to obtain an updated I-$V_{gs}$ model; and calculating the compensation parameter based on the updated I-$V_{gs}$ model;

wherein I is output current data in test information, $V_{gs}$ is a test signal voltage in the test information;

wherein in the first compensation data update period, the testing the drive transistors of sub-pixels in the $N^{th}$ row to obtain the first test information; testing the drive transistors of sub-pixels in the $M^{th}$ row to obtain the second test information; calculating the compensation parameter based on the first test information and the second test information; and compensating the sub-pixels in the $N^{th}$ row, the sub-pixels in the $M^{th}$ row and the sub-pixels in a rows adjacent to the $N^{th}$ row and the $M^{th}$ row based on the compensation parameter comprises:

in the first compensation data update period, testing the drive transistor of the sub-pixel in an odd-numbered row twice, to obtain the first test information and the second test information respectively;

calculating a first compensation parameter based on the first test information and the second test information; and compensating the sub-pixel in the odd-numbered row and the sub-pixels in odd-numbered rows adjacent to the odd-numbered row, based on the first compensation parameter;

wherein subsequent to the compensating the sub-pixel in the odd-numbered row and the sub-pixels in the odd-numbered rows adjacent to the odd-numbered row based on the first compensation parameter, the method further comprises:

in a second first compensation data update period subsequent to the first compensation data update period, testing the drive transistor of the sub-pixel in an even-numbered row twice, to obtain third test information and fourth test information respectively;

calculating a second compensation parameter based on the third test information and the fourth test information; and compensating the sub-pixel in the even-numbered row and the sub-pixels in even-numbered rows adjacent to the even-numbered row, based on the second compensation parameter.

2. The organic light emitting diode pixel compensation method according to claim 1, wherein the testing the drive transistors of the sub-pixels in the $N^{th}$ row and obtaining the first test information and testing the drive transistors of the sub-pixels in the $M^{th}$ row and obtaining the second test information comprises:

applying a test signal voltage to a control terminal of each drive transistor through a data line, to turn on the drive transistor; and acquiring output current data of the drive transistor, wherein the first test information and the second test information each comprises a test signal voltage and the output current data.

3. The organic light emitting diode pixel compensation method according to claim 1, wherein the compensation parameter is an equation comprising variables representing a threshold voltage and mobility of the drive transistor.

4. The organic light emitting diode pixel compensation method according to claim 3, wherein the calculating the compensation parameter based on the first test information and the second test information comprises:

calculating the compensation parameter based on the following formulas:

$$I_1 = K*u(V_{gs1} - V_{th})^2$$

$$I_2 = K*u(V_{gs2} - V_{th})^2$$

where $I_1$ is the output current data in the first test information, $I_2$ is the output current data in the second test information, $V_{gs1}$ is the test signal voltage in the first test information, $V_{gs2}$ is the test signal voltage in the second test information, u is the mobility of the driving transistor, $V_{th}$ is the threshold voltage, and K is a constant and equals to ½*Cox*W/L, wherein Cox is a dielectric constant of a gate insulating layer of the drive transistor, and W/L is a width to length ratio of the drive transistor.

5. The organic light emitting diode pixel compensation method according to claim 1, further comprising: testing the drive transistors of the sub-pixels in the $N^{th}$ row and the $M^{th}$ row during a data blank time period of each frame.

6. The organic light emitting diode pixel compensation method according to claim 2, wherein the compensation parameter is an equation comprising variables representing a threshold voltage and mobility of the drive transistor.

7. The organic light emitting diode pixel compensation method according to claim 1, wherein N is an odd number, M is an even number following N, and the compensating the sub-pixels in the $N^{th}$ row, the sub-pixels in the $M^{th}$ row and the sub-pixels in a rows adjacent to the $N^{th}$ row and the $M^{th}$ row based on the compensation parameter comprises:

compensating the sub-pixels in the $N^{th}$ row and the sub-pixels in the $M^{th}$ row based on the compensation parameter.

8. The organic light emitting diode pixel compensation method according to claim 1, wherein N and M are each an odd number, and the compensating the sub-pixels in the $N^{th}$ row, the sub-pixels in the $M^{th}$ row and the sub-pixels in a rows adjacent to the $N^{th}$ row and the $M^{th}$ row comprises:

compensating the sub-pixels in the $N^{th}$ row, the sub-pixels in the $M^{th}$ row and the sub-pixels in odd-numbered rows adjacent to the $N^{th}$ row and the $M^{th}$ row based on the compensation parameter.

9. The organic light emitting diode pixel compensation method according to claim 8, wherein N and M are each an even number, and the compensating the sub-pixels in the $N^{th}$ row, the sub-pixels in the $M^{th}$ row and the sub-pixels in a rows adjacent to the $N^{th}$ row and the $M^{th}$ row further comprises:

compensating the sub-pixels in the $N^{th}$ row, the sub-pixels in the $M^{th}$ row and the sub-pixels in even-numbered rows adjacent to the $N^{th}$ row and the $M^{th}$ row based on the compensation parameter.

10. The organic light emitting diode pixel compensation method according to claim 1, wherein N and M are each an even number, and the compensating the sub-pixels in the $N^{th}$ row, the sub-pixels in the $M^{th}$ row and the sub-pixels in a rows adjacent to the $N^{th}$ row and the $M^{th}$ row comprises:
 compensating the sub-pixels in the $N^{th}$ row and the sub-pixels in odd-numbered rows adjacent to the $N^{th}$ row based on the compensation parameter; and
 compensating sub-pixels in the $M^{th}$ row and the sub-pixels in odd-numbered rows adjacent to the $M^{th}$ row based on the compensation parameter.

11. An organic light emitting diode pixel compensation device, comprising:
 a first test information obtaining module, configured to test drive transistors of sub-pixels in an $N^{th}$ row to obtain first test information;
 a second test information obtaining module, configured to test drive transistors of sub-pixels in an $M^{th}$ row to obtain second test information;
 a compensation parameter obtaining module, configured to calculate a compensation parameter based on the first test information and the second test information; and
 a pixel compensating module, configured to compensate the sub-pixels in every row based on the compensation parameter,
 wherein the testing the drive transistors of the sub-pixels in the $N^{th}$ row and obtaining the first test information and testing the drive transistors of the sub-pixels in the $M^{th}$ row and obtaining the second test information comprises:
 applying a test signal voltage to a control terminal of each drive transistor through a data line, to turn on the drive transistor;
 charging a test capacitor through an output current of the drive transistor; and
 detecting a voltage of the test capacitor and obtaining output current data of the drive transistor based on the voltage of the test capacitor,
 wherein the first test information and the second test information each comprises the test signal voltage and the output current data;
 the test capacitor is grounded;
 wherein a time interval between the testing the drive transistors of the sub-pixels in the $N^{th}$ row to obtain the first test information and the testing the drive transistors of the sub-pixels in the $M^{th}$ row to obtain the second test information is a period of one frame;
 the organic light emitting diode pixels at least comprises a red sub-pixel, a green sub-pixel and a blue sub-pixel, the red sub-pixel, the green sub-pixel and the blue sub-pixel are connected to a same data line, and configured to be applied a same detection signal;
 wherein the compensation parameter obtaining module is further configured to:
 update an initial $I\text{-}V_{gs}$ model based on the first test information and the second test information, to obtain an updated $I\text{-}V_{gs}$ model; and
 calculate the compensation parameter based on the updated $I\text{-}V_{gs}$ model;
 wherein I is output current data in test information, $V_{gs}$ is a test signal voltage in the test information;
 wherein in a first compensation data update period,
 the first test information obtaining module and the second test information obtaining module are configured to test the drive transistor of the sub-pixel in an odd-numbered row for a first time and a second time respectively, to obtain the first test information and the second test information respectively;
 the compensation parameter obtaining module is configured to calculate a first compensation parameter based on the first test information and the second test information; and
 the pixel compensating module is configured to compensate the sub-pixel in the odd-numbered row and the sub-pixels in odd-numbered rows adjacent to the odd-numbered row, based on the first compensation parameter;
 wherein in a second first compensation data update period subsequent to the first compensation data update period,
 the first test information obtaining module and the second test information obtaining module are configured to test the drive transistor of the sub-pixel in an even-numbered row twice, to obtain third test information and fourth test information respectively;
 the compensation parameter obtaining module is configured to calculate a second compensation parameter based on the third test information and the fourth test information; and
 the pixel compensating module is configured to compensate the sub-pixel in the even-numbered row and the sub-pixels in even-numbered rows adjacent to the even-numbered row, based on the second compensation parameter.

12. A display device, comprising the organic light emitting diode pixel compensation device according to claim 11.

13. The display device according to claim 12, further comprising:
 a display panel, comprising a plurality of sub-pixels arranged in an array form, a plurality of scan lines and data lines coupled to every sub-pixels;
 a source electrode driver, coupled to the organic light emitting diode pixel compensation device and configured to generate a raw data signal and output, to the data lines, a compensated data signal formed by compensating the raw data signal through the organic light emitting diode pixel compensation device; and
 a gate electrode driver, coupled to the scan lines and configured to generate a scan signal and output the scan signal to the scan lines of the display panel.

\* \* \* \* \*